(12) United States Patent
Hanham et al.

(10) Patent No.: US 10,498,362 B2
(45) Date of Patent: Dec. 3, 2019

(54) LOW POWER ERROR CORRECTING CODE (ECC) SYSTEM

(71) Applicant: Kabushiki Kaisha Toshiba, Minato-ku, Tokyo (JP)

(72) Inventors: Paul Hanham, Didcot (GB); Josh Bowman, Didcot (GB); David Symons, Kidlington (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 15/383,877

(22) Filed: Dec. 19, 2016

(65) Prior Publication Data

US 2018/0175882 A1    Jun. 21, 2018

(51) Int. Cl.
| H03M 13/11 | (2006.01) |
|---|---|
| H03M 13/15 | (2006.01) |
| H03M 13/29 | (2006.01) |
| H03M 13/37 | (2006.01) |
| H03M 13/00 | (2006.01) |

(52) U.S. Cl.
CPC .... *H03M 13/1108* (2013.01); *H03M 13/1111* (2013.01); *H03M 13/152* (2013.01); *H03M 13/2906* (2013.01); *H03M 13/2951* (2013.01); *H03M 13/3715* (2013.01); *H03M 13/6502* (2013.01); *H03M 13/6511* (2013.01)

(58) Field of Classification Search
CPC .. H03M 13/05; H03M 13/613; H03M 13/255; H03M 13/1108; H03M 13/6511; H03M 13/6502; H03M 13/1111; H03M 13/2951; H03M 13/2906; H03M 13/152; H03M 13/3715
See application file for complete search history.

(56) References Cited

U.S. PATENT DOCUMENTS

| 8,171,367 B2 | 5/2012 | Gao et al. |
|---|---|---|
| 8,327,242 B1 | 12/2012 | Anholt et al. |
| 8,370,727 B2 | 2/2013 | Yang |
| 8,429,498 B1 | 4/2013 | Anholt et al. |
| 8,448,050 B2 | 5/2013 | Sakaue et al. |
| 8,468,434 B2 | 6/2013 | Toda |

(Continued)

OTHER PUBLICATIONS

G. Spourlis et al. "Error Floor Compensation for LDPC Codes Using Concatenated Schemes" IEEE Workshop on Signal Processing Systems, pp. 156-160 (2012).

(Continued)

*Primary Examiner* — April Y Blair
*Assistant Examiner* — Rong Tang
(74) *Attorney, Agent, or Firm* — White & Case LLP (57) ABSTRACT

A system for an Error Correction Code ("ECC") decoder includes a first decoder and a second decoder. The first decoder is configured to determine a first estimated number of errors in encoded data received at the first decoder and to compare the first estimated number of errors to a first threshold and a second threshold. The second decoder is configured to receive the encoded data when the first estimated number of errors is below the first threshold and is above a second threshold. When the first estimated number of errors is above the first threshold, the first decoder passes the encoded data out of the ECC. The first decoder has a lower power consumption than the second decoder.

18 Claims, 9 Drawing Sheets

(56) References Cited

U.S. PATENT DOCUMENTS

| | | |
|---|---|---|
| 8,935,595 B2 | 1/2015 | Zhong et al. |
| 9,037,953 B2 | 5/2015 | Li et al. |
| 9,244,765 B2 | 1/2016 | Dror |
| 9,270,297 B2 | 2/2016 | Sharon et al. |
| 9,294,129 B2 | 3/2016 | Zhu et al. |
| 9,432,053 B1 | 8/2016 | Graumann et al. |
| 9,614,547 B2 * | 4/2017 | Fainzilber .......... H03M 13/1108 |
| 2011/0314354 A1 * | 12/2011 | Fillingim ............ G06F 11/1048 714/760 |
| 2016/0006459 A1 | 1/2016 | Hanham et al. |
| 2016/0006462 A1 | 1/2016 | Hanham et al. |
| 2016/0094247 A1 | 3/2016 | Parthasarathy et al. |
| 2016/0179620 A1 | 6/2016 | Bazarsky et al. |

OTHER PUBLICATIONS

Jens Spinner et al., "Decoder architecture for generalised concatenated codes", IET Circuits, Devices & Systems, vol. 9, Iss. 5 pp. 328-335, (2015).
Intel Technology Journal, vol. 17, Issue 1, pp. 1-200 (2013).
Varsha Regulapati, "Error Correction Codes in NAND Flash Memory", pp. 1-66 (Dec. 2015).

* cited by examiner

LOW POWER ERROR CORRECTING CODE (ECC) SYSTEM

FIELD OF THE INVENTION

The present invention is generally related to systems and methods to reduce the power consumption of an Error Correcting Code (ECC) system by implementing checks to route the received codewords to an appropriate decoder.

BACKGROUND OF THE INVENTION

ECC systems are used in a variety of applications including data storage systems and digital communication. Commonly, ECC systems use low-density parity check ("LDPC") codes or Bose Chaudhuri Hocquengheim ("BCH") codes. LDPC codes are block codes which use probability-based repeated calculations for error correction. LDPC codes exhibit excellent performance, which has been reported to approach the Shannon limit, a theoretical limit of code performance. BCH codes and other Hamming codes are hard decision codes which enable precise control over the number of bit errors that are correctable by the code. BCH codes can be designed to correct multiple bit errors and have been shown to reliably correct a certain number of errors. However, in order to provide a sufficient level of error correction for a system, the decoder in traditional ECC systems requires a large amount of computational power. Reduction of the power required by the system to successfully decode transmitted data is possible by implementing changes in the decoder.

ECC systems are designed to detect and correct the expected errors to be encountered in the systems they operate within. In particular, in storage devices that employ NAND flash memory, the specific error characteristics of those memory devices must be taken into account. For instance, it is well known that NAND flash memory cells must be first erased before data can be written to them (writing is known as programming in NAND flash technology). The cells are known to have a limited lifetime in terms of the number of Program/Erase (P/E) cycles they are subjected to. Further, the more P/E cycles the cells have been subjected to, the greater likelihood that errors occur when reading data that has been previously written. It is also well-known that the writing of data involves storing a charge on a floating gate in the memory cell. Over time, this charge may leak away, or may be disturbed by the subsequent erasing, reading, or writing of data to neighboring cells. This means that the longer the data has been retained or stored in the cell, the more likely that the charge leaks or is otherwise disturbed, with the result that it becomes increasingly likely that errors occur when the data is subsequently read, as the charge value is not the same as that which was originally stored. These error characteristics have also worsened with the advent of multilevel cell (MLC), triple level cell (TLC) and quadruple level cell (QLC) memory technology, with reduced capability of P/E cycles and retention time.

Over the lifetime of a memory device using NAND flash memory therefore, the rate of errors occurring increases considerably, possibly by several orders of magnitude. In order to cope with the high error rates encountered towards the end of the lifetime of NAND flash memory and in particular with MLC, TLC and QLC type memories, the more capable error correction codes such as LDPC codes are commonly employed. An ECC system designed to cope with the worst case of high error rates at the end of life, would, however, be operating very inefficiently with un-necessarily high power consumption during a large period of the lifetime where error rates are low.

Improvements to ECC systems which lower the energy consumption are particularly sought after, as many traditional ECC systems consume large amounts of processing power. Traditional ECC systems access memory where variables related to the decoding algorithms used in the ECC system are stored, with large power requirements. For example, LDPC code has high throughput but in using an iterative decoding process requires significant computation resources and has high energy consumption compared to other types of ECC systems. Development of low energy-consuming ECC systems is critical for implementation of ECC systems in mobile or portable devices, data centers, or in "green" computing.

One solution to this may be to employ two ECC decoders, the first a low power, low error correcting capability decoder, and the second a higher power, high error correcting capability decoder. However a further complication is that there is also a wide variation in error rates between individual flash memory dies, between flash memory blocks within a die, and between flash memory pages within a block. A two decoder system which simply switches between the two decoders may not be able to operate efficiently without a means to correctly select and switch between the decoders according to the encountered error rate.

Other methods of improving the energy efficiency of the ECC system include reducing the computational work to decode a unit of data or decreasing issues in the auxiliary circuitry implementation. Layered decoding, turbo decoding, iteration control and use of simpler decoding algorithms have been used to attempt to increase energy efficiency on ECC systems.

In another example of attempts to increase energy efficiency of ECC systems, gear-shift decoding has been suggested as a mechanism by which to lower the power consumption of decoding. Gear-shift decoders change their update rules over the course of decoding a single frame. These decoders may start with simple update rules which sequentially proceed to more complex rules for energy efficiency purposes. However, optimization of the scheduling of the rule is complicated and the complex rules consume large amounts of power.

Low power consumption decoding methods must be developed in order to provide decoding for mobile devices and services and data centers. Decoding systems which have high throughput, however, often have high power requirements and current methods for lowering the power consumption of such system are insufficient. In addition, systems employing two or more decoders cannot react sufficiently quickly to error rates which vary widely both instantaneously and over longer periods of time.

BRIEF DESCRIPTION OF THE INVENTION

In an aspect, an ECC decoder includes a first decoder which estimates a first number of errors in encoded data received at the first decoder and compares the first number of errors to a first and a second threshold. A second decoder of the ECC is configured to receive the encoded data when the first number of errors is below the first threshold and is above the second threshold. The first decoder is configured to bypass the second decoder and send the encoded data out of the ECC when the first number of errors is above the first threshold.

In another aspect, a method of decoding encoded data at an ECC decoder includes receiving encoded data at a first decoder, determining at the first decoder a first estimated number of errors in the encoded data and comparing the first estimated number of errors to a first and second threshold. The encoded data is then send to a second decoder when the first estimated number of errors is below the first threshold and is above the second threshold and the encoded data is sent out of the ECC when the first estimated number of errors is above the first threshold.

DETAILED DESCRIPTION OF THE INVENTION

Figure 1:
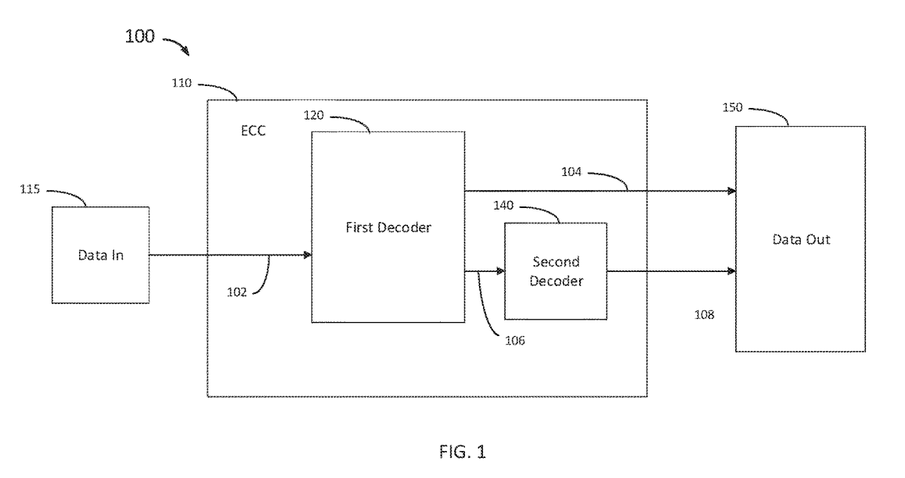
FIG. 1 shows a block diagram that illustrates an ECC system including a first and second decoder, according to an embodiment.

FIG. 1 shows a block diagram 100 that schematically illustrates an ECC system 110 in accordance with an embodiment of the present invention. ECC system 110 is coupled to a storage device 115 and a data repository 150, and includes a first decoder 120, a second decoder 140. The storage device 115 stores received encoded data waiting to be passed to the ECC system 110 for decoding. Once the encoded data has been passed to the ECC system 110, it is subjected to a series of checks to determine which of the first decoder 120 and the second decoder 140 should be used to decode the data.

The decoders are chosen according to their error correcting capability and their power consumption. The first decoder is designed to operate with low power consumption using internal registers rather than external memory and to correct errors according to a range of data read error rates which might encompass a large majority of the read errors encountered during most of the intended operating life of the storage device. For a solid state drive (SSD) storage device, the guaranteed operating life might be of the order of 5 years, where the first decoder could correct, say, 99.9% of all read errors encountered in the first 3-4 years of life. The second decoder is designed to be able to correct the worst case error rates expected in the lifetime of the SSD, but operate with higher power consumption using external memory. While the first decoder is being employed to decode data, the second decoder has its clock circuitry disabled, consuming minimal power, until the first decoder determines that the error rate is too great and the second decoder should attempt decoding. With a low power first decoder operating 99.9% of the time and consuming between 20 and 25% of the power of the higher power decoder, the overall power consumption is reduced to approximately 20 to 25% of the power if the system operated with just the second decoder operating 100% of the time.

In an SSD, there may also be multiple ECC systems, one for each of a number of parallel channels, each channel connected to a number of flash memory devices. By designing the first decoder in a channel's ECC system to be able to decode a very large fraction (99.9%) of the data being read, then it follows that the second decoder is only employed for a very small fraction (0.1%) of the data being read. In this case, it becomes possible to share a single second decoder between multiple channels, for instance if a single second decoder could provide the capability for 4, 8, or 16 channels and still only be operating for less than 2% of the time. Besides a saving in power, in an implementation using an application specific integrated circuit (ASIC), the amount of chip area used by the second decoders may be significantly reduced, which reduces the overall size and cost of the chip.

By way of example, the error rates for a fresh (low PE/CE cycle) memory might exhibit errors in the range of 0-16 per 4 k byte memory page when reading immediately after writing. For a page in a block subjected to 10 k P/E cycles, this may rise to 0-50 errors, a variation of approximately 3× due to the effect of increased P/E cycles. If that data is retained for up to 10 days, the worst case error rate may increase to around 150 errors per page, a further increase of 3× due to the increased retention period. Depending on the profile of usage of the SSD in terms of the amount of data being written to the drive, also the length of time that any data written may be stored before being required to be read again, error rates may vary by up to 3 orders of magnitude (0-100 being 2 orders of magnitude and 0-150 somewhere between 2 and 3). The second decoder is designed to have an error correcting capability of at least 2 or 3 orders of magnitude better than the first decoder.

An amount of received encoded data is passed from the storage device 115 into the ECC system 110 along path 102. The amount of received encoded data is presented to the first decoder 120. A check by the decoder is performed to determine how the packet of received encoded data should be decoded. In some implementations, this check may be performed by calculation of an initial LDPC syndrome by the decoder. If the received encoded data is error free or the received encoded data has a number of errors such that the encoded data cannot be successfully decoded, the received encoded data can be passed from the first decoder 120 out of the ECC system 110 along path 104 without being decoded. In the event that the data cannot be decoded, then an unrecoverable error indication shows that the data is invalid. Data which is passed out of the ECC system 110 is sent to the data repository 150.

Alternatively, the data can continue with the first decoder 120 where an attempt at decoding the data is made. If the first decoder 120 succeeds in decoding the data, the data may also be passed out of the ECC system 110 along path 104. If the first decoder 120 does not successfully decode the data during the decoding attempt, the data can be passed to the second decoder 140 along path 106. The second decoder 140 then attempts to decode the data. Successfully decoded data is passed from the second decoder 140 to the data repository 150 along path 108. Data can also be passed from the first decoder 120 to the second decoder 140 without any attempt by the first decoder 120 to decode the data.

In some implementations, a first check is conducted when the data is received by the ECC system 110. The first check determines the initial destination for the data to be decoded. The first check may be conducted by a control mechanism (not shown, described in context of FIG. 4) using information from the first decoder 120 equipped to determine a relative or actual number of errors in the received data and to compare the number of errors to one or more predetermined thresholds. For example, a parity-check condition can be checked by decoding the received bits of data and comparing the calculated parity bits with the received parity bits. If there is no difference between the received parity bits and the decoded parity bits, the received data is valid and contains no errors. The valid received data can be passed out of the ECC system 110 without further decoding, and can proceed to a next processing step. In some implementations, the component of the first decoder 120 which conducts the first check uses for example, an LDPC syndrome, a BCH error locator polynomial ("ELP"), or another measurement of errors in the data may be calculated.

If the data is routed to the first decoder 120, a second check is performed after an attempt has been made by the first decoder 120 to decode the data. The second check may also be conducted by a control mechanism, the same or different than the control mechanism conducting the first check, and may use a new determination by the second decoder of a number of errors remaining in the data. The second check may alternatively be conducted by a component of the circuitry of the first decoder, for example, a BCH decoder can calculate a BCH ELP. In some implementations, the second check also includes a calculation of a number of error locations in the data. The calculations of the second check can be compared to one or more predetermined thresholds, and a determination can be made as to where the data should be routed for continued decoding.

In some implementations, the data is written to a flash memory such as a NAND flash. Encoded data read and received at the ECC system 110 from a flash memory may degrade over the course of time such that packets read soon after being written are error-free or relatively error free, while packets read long after being written may include many errors. To begin with, soon after writing, the system may operate in a relatively high signal-to-noise ("SNR") region, meaning that the input error rate of the channel decoder is very small or error free. Error free blocks require no decoding step for many decoding algorithms. Later, a long time after writing, the error rate tends to increase and the system effectively operates in a lower SNR region. This is due to the well-known phenomenon of retention time increasing the error rate in NAND flash memory cells. Similar large variations of error rates and SNR may be found in satellite television transmission systems, for example due to signal absorption in rain or snow weather conditions.

In some implementations, the data is passed through a descrambler (not shown) before being received by the ECC system 110. In some implementations, the ECC system 110 uses a memory (not shown) to store data used by the first decoder 120 and the second decoder 140. In some implementations in application specific integrated circuits (ASICs), the ECC system 110 uses registers (not shown, described in context of FIG. 4) to store data used by the first decoder 120 and the second decoder 140. Storing data in registers rather than in the memory may further decrease the power used by the decoders during operation, as the power used by many decoding algorithms, such as an LDPC algorithm, is traditionally dominated by the power required to repeatedly access the memory.

In implementations such as an ASIC, small amounts of read/write storage may be conveniently provided using so-called register storage where individual bytes or words of data may be stored. Requirements for larger areas of storage, of the order of kilobytes or megabytes, require more power hungry blocks of DRAM or SRAM to be implemented on the ASIC.

In some implementations, the first decoder is a hard-bit decoder, which uses a register-based single-bit-voting (bit-flipping) LDPC algorithm combined with a BCH decoder or other decoder using a Hamming code. The BCH decoder is able to correct errors which remain after the LDPC algorithm has decoded the received data using a predetermined number of iterations. Hard-bit-voting algorithms can be implemented with much less stored data, and if the hard-bit-voting decoder is able to decode the majority of the received encoded data, the power consumption of the overall system is reduced.

By subjecting the received data to a check before decoding has begun, an appropriate decoder can be chosen based on the calculated or estimated number of errors present in the received data. This allows a low-power decoder to be used for the majority of received data, while employing a higher powered strong decoder for received data which have more errors making them more difficult to decode. Additionally, error-free data or data with too many errors can be passed out of the ECC system 110 after an initial calculation and check of the LDPC syndrome, thereby ensuring no processing power has been wasted in an attempt to fully decode the data.

While performing an initial check determines the appropriate decoder for the received data, if required, the additional check after the first decoder 120 has attempted to decode the data allows the ECC system 110 to determine if the decoding has been completed. Stopping the decoding when the data has been successfully decoded eliminates wasteful iterations that use power but do not provide any additional information in terms of decoding the data.

Figure 2:
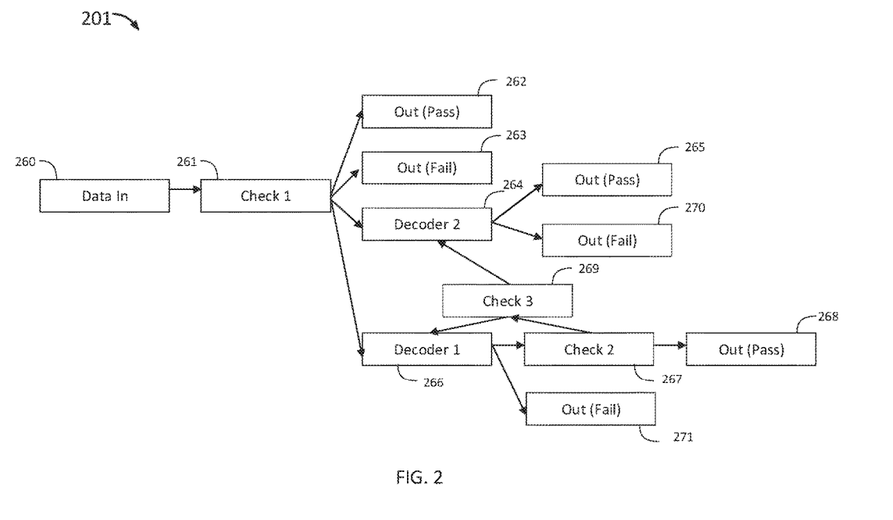
FIG. 2 shows a flow chart that illustrates an ECC system including a system of checks to determine the decoding path for a received encoded data, according to an embodiment.

FIG. 2 shows a flow chart 201 of an ECC system including a system of checks to determine the decoding path for a received data. The ECC system may be arranged as depicted in the block diagram of FIG. 1, or may be arranged in any other suitable manner. The flow chart 200 includes a first step 260 at which point data enters the ECC system. The data may be read into the system from a storage device or received into the system directly from a source. The data is a series of bits which may include errors which have arisen during transmission, for example, due to noise in a transmission channel. The data may be data from a flash memory, and in particular may be a portion of a flash page, such as a quarter of a page. The data may include both message bits and parity bits which have been added to the message data before sending on the transmission channel or writing to the flash memory. The message bits and parity bits together are known as an ECC codeword. Prior to entering the ECC system, the data may undergo initial processing, such as separating a packet of data from a larger amount of data for decoding.

At step 261, an initial check is performed on the received data. The check is a calculation of a relevant parameter indicative of a relative or actual number of errors in the received data which is compared to one or more predetermined thresholds. In some implementations, the check may be a calculation of the LDPC syndrome. The thresholds may indicate a number of errors above or below which a specific action should be taken with the received data. For example, the relevant parameter can be compared to a first threshold and a second threshold. In some implementations, a threshold is a value of an LDPC syndrome which indicates that the data contains no errors (an LDPC syndrome of zero). The threshold may be a value of an LDPC syndrome which indicates that the data contains too many errors to be decoded. The threshold may be a value of an LDPC syndrome above which the first decoder is not capable of decoding the data. The thresholds may be predetermined based on the expected error rate of a transmission or any relevant parameter. Based on a comparison of the calculated parameter to the predetermined thresholds, the data may be passed to step 262, step 263, step 264, or step 266.

At step 262, the data is marked as decoded and is passed out of the ECC system. In some implementations, the calculation of the relevant parameter may reveal that there are no errors in the received data. For example, if calculation of the LDPC syndrome produces an LDPC syndrome equal to zero, the data contains no errors. In such cases, the data is passed out of the ECC system as successfully decoded data. Sending the data out of the ECC system if it is received error-free prevents expenditure of unnecessary resources.

At step 263, the data is marked as failed and is passed out of the ECC system. In some implementations, the first threshold is a number of errors above which the data is determined to contain a number of errors such that a successful decode of the data is unlikely. In such cases, the data is passed out of the ECC system without attempting a decode in order to avoid wasting resources attempting to decode data unlikely to be successfully decoded regardless of the computing power applied. In some implementations, the data is passed out to a data repository or storage. In some implementations, the data is passed out of the ECC system and a flag or entry in a log is recorded to indicate the failed data was not decoded, known as an unrecoverable error in flash memory systems in which case all the data is deemed unreliable. In some implementations, the data is passed out to a storage device which is configured to return the data to the queue to be passed back into the ECC system at a later time. Putting the data into the ECC system to retry allows the system to quickly decode the majority of the data in a short amount of time, for example at a first low power decoder, and more difficult and error-filled data packets are decoded by a stronger decoder at a later time. This increases a speed with which a majority of the transmitted data can be decoded. In some implementations, the data is passed out of the ECC system and a request is sent for the portion of the transmission in which the data was originally located to be retransmitted. In some implementations, a request is sent for data to be re-read from memory using the same or different voltage thresholds.

At step 264, the data is passed to the second decoder in response to the first check. The second decoder is a stronger decoder than the first decoder and in some cases may be an inline decoder. The data is passed to the second decoder in cases in which the calculated number of errors in the data is below the threshold for failing the data, but is above a threshold number of errors for which the first decoder can reliably or quickly decode the data. After receiving the data, the second decoder attempts to decode the data. If the decoder fails, at step 270 the data is passed out of the ECC system with a failure error. At step 265, the data is fully decoded and the second decoder passes the decoded data out of the ECC system. In some implementations, the data is passed out to a data repository or storage. In some implementations, information about the successfully decoded data is recorded, such as the value of the first calculated relevant parameter and the decoder which successfully decoded the data, or the decoding pathway of the data through the system in the case that multiple decoders attempted to decode the data.

At step 266, the data is instead passed to the first decoder after the first check. The first decoder is a low-power decoder, such as an LDPC decoder. In some implementations, the first decoder includes an LDPC algorithm in combination with a BCH algorithm or other Hamming code. The data is passed to the first decoder if the first calculated relevant parameter is below a first threshold and below a second threshold such that the calculated number of errors in the data is below the threshold number of errors which the first decoder can successfully decode. For example, the first relevant parameter can be an LDPC syndrome which is compared to a first threshold value at or above which the data contains too many errors to be decoded. If the LDPC syndrome is below this threshold, the LDPC syndrome is compared to the second threshold value below which the data can be decoded by the first decoder. Once the data has been passed into the first decoder, the decoder attempts to decode the data by identifying and correcting errors in the data. In some implementations, the LDPC decoder iteratively corrects errors in the code for a predetermined number of iterations.

After a predetermined number of iterations of the LDPC algorithm have been performed, the algorithm stops and a second check is performed at step 267. The second check includes a calculation of a second relevant parameter which may be the same parameter as in the first check, and a comparison of the second relevant parameter to one or more predetermined thresholds. In addition to the second relevant parameter, other parameters may be included. In some implementations, the second relevant parameter is an estimated number of errors remaining in the data. In some implementations, the second relevant parameter is a calculation of error locations in the data. In some implementations, both the estimated number of errors remaining in the data and the error locations in the data are calculated as part of the second check. In some implementations, an LDPC syndrome is recalculated and a BCH error locator polynomial (ELP) is also calculated. Both the BCH ELP and the number of roots which satisfy the ELP may be calculated during the second check. In some implementations, a BCH ELP and the number of roots are calculated first and compared to a third predetermined threshold to determine if the data has been successfully decoded. If the data is determined to have been successfully decoded by a comparison of the calculated second relevant parameter, the data is passed out of the ECC system at step 268.

If, during the second check at step 267, the data is determined not to have been successfully decoded by a comparison of the calculated second relevant parameter to a third threshold, an additional third relevant parameter is compared to a fourth predetermined threshold at the third check at step 269. In some implementations, the third relevant parameter is calculated at the same time as the second relevant parameter, and is considered a part of the second check occurring at step 267. In some implementations, the third relevant parameter is only calculated if the comparison of the second relevant parameter to the third predetermined threshold indicates that the data has not been fully decoded. In some implementations, the third relevant parameter is an estimate of the remaining errors in the data. In some implementations, the third relevant parameter is the LDPC syndrome.

At step 269, the third relevant parameter is compared to a fourth predetermined threshold, and based on the comparison to the fourth predetermined threshold, is passed to the second decoder at step 264, or is reiterated through the first decoder at step 266. If the third relevant parameter is compared to the fourth predetermined threshold and it is determined that the number of estimated remaining errors in the data is higher than an acceptable number of estimated remaining errors for the first decoder to handle, the data is passed to the second decoder for continued decoding, and the process continues from step 264. If the third relevant parameter is compared to the fourth predetermined threshold and it is determined that the number of estimated remaining errors in the data can be decoded by the first decoder, the data stays in the first decoder at step 266. The first decoder may continue to attempt to decode the data for a set number of iterations before the second check is performed again. The first decoder may also determine that the decoding has failed and at step 271 the data is passed out of the ECC system with a failure error.

The inclusion of multiple checks during the decoding process allows the ECC system to efficiently process the data by directing it to an appropriate decoder, and to act in an energy efficient manner by stopping the decoding algorithms when the data has been decoded, cannot be decoded, or needs to be decoded by a different decoder.

Although the ECC system is depicted having two decoders, any number of decoders may be included. Additional decoders which have different decoding capabilities may be included along with additional checks of the control mechanism to determine to which of the decoders data should be directed. Decoders having a similar or the same decoding capabilities may further be included in the ECC system to allow the decoders to work in parallel. Furthermore, in systems having a first low power decoder and a second higher powered decoder, the first decoder and the second decoder may decode packets of data in parallel such that the first decoder is attempting to decode a first packet while the second decoder is decoding a second packet.

Figure 3:
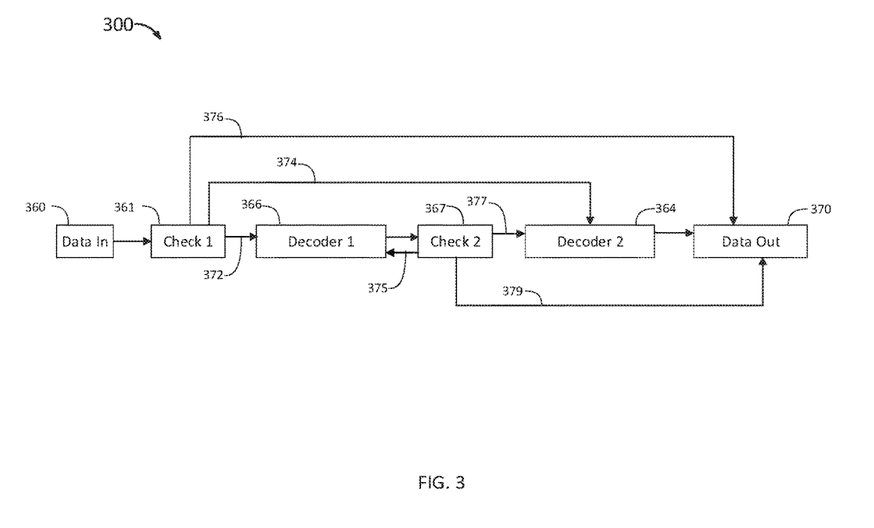
FIG. 3 shows a flow chart that illustrates a received encoded data moving through an ECC system including a system of checks, according to an embodiment.

FIG. 3 shows a flow chart 300 of received data moving through an ECC system including a system of checks. The flow chart 300 illustrates the possible paths that the data may take through the ECC system as opposed to the traditional linear path through the decoders of the ECC system. In traditional ECC systems, one or more decoders are arranged in a linear scheme such that data enters a decoder, is fully or partially decoded, and is passed out of the system or to the next decoder. In the ECC system depicted in flow chart 300, the data is directed through the system based on checks which are performed by a control mechanism that calculates a parameter related to the number of errors in the data and makes a determination of where the data will be directed based on a comparison of the data to a predetermined threshold.

The flow chart 300 begins with the data entering the system at block 360. The data is then subjected to a first check at block 361. As a result of the first check, the data can be directed to one of three pathways, the first possible pathway 372, the second possible pathway 374, and the third possible pathway 376. The first possible pathway 372 directs the data to the first decoder at block 366, as in the traditional linear ECC system. The second possible pathway 374 bypasses the first decoder at block 366 and instead directs the data directly to the second decoder at block 364. The third possible pathway 376 bypasses both the first decoder at block 366 and the second decoder at block 364 and instead directs the data out of the ECC system to block 370.

Data that is directed to the first decoder at block 366 is subjected to a decoding attempt which may include multiple iterations of an iterative decoding scheme. The data is then subjected to a second check at block 367. At the second check at block 367, the relevant parameter is again determined and compared to a threshold. An additional parameter may also be determined at the second check, and the additional parameter may be compared to an additional threshold. The outcome of the second check comparison of the relevant parameters to the thresholds is to pass the data along path 375 to block 366, along path 377 to block 364, or along path 379 to block 370. When the second check at block 367 indicates that the decoding of the data is complete, the data is passed along path 379 out of the ECC system to block 370. When the second check at block 367 indicates that the first decoder has not successfully decoded the data and that it is unlikely that the first decoder will be able to decode the data, the data is passed on to the second decoder at block 364 along path 377. When the second check at block 367 indicates that the first decoder has not successfully decoded the data, but is likely to successfully complete the decoding with additional iterations, the data is returned to the first decoder along path 375 where it is subjected to additional iterations of the decoding algorithm. After a predetermined number of additional iterations, the data is again subjected to the second check at block 367.

Figure 4:
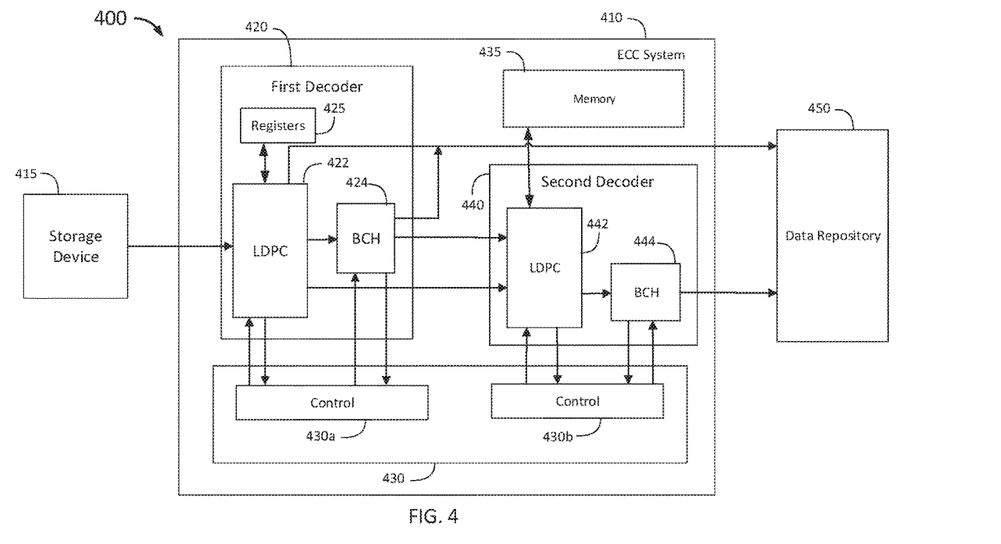
FIG. 4 shows a block diagram that schematically illustrates an ECC system including a first decoder and a second decoder, according to an embodiment.

FIG. 4 shows a block diagram 400 that schematically illustrates an ECC system 410 including a first decoder 420 made up of an LDPC algorithm 422, a set of registers 425, and a BCH algorithm 424 (which may decode in combination), and a second decoder 440. The second decoder 440 is made up of an LDPC algorithm 442 and a BCH algorithm 444 (which may decode in combination), and is connected to an external memory 435. The ECC system 410 also includes a control mechanism 430, made up of control mechanisms 430a and 430b. The block diagram 400 further depicts a storage device 415 and a data repository 450. In some implementations, the LDPC algorithm and the BCH algorithms are combined within either or both of the first decoder 420 and the second decoder 440.

The storage device 415 may include any amount of data from one or more sources. The data may be queued in the storage device 415, such that equal-sized packets of data are directed into the ECC system 410. The data may further be queued in the storage device 415, such that the data is directed into the ECC system 410 in a same order as the data was received at the storage device (FIFO).

Upon entering the ECC system 410, data sent from the storage device 415 may first be directed to the first decoder 420 which calculates a first LDPC syndrome, $S_0$ and sends this to the control mechanism 430a The control mechanism 430a compares the calculated $S_0$ to a first predetermined threshold and a second predetermined threshold, $T_1$ and $T_2$, respectively. $T_1$ is a value above which the ECC system 410 cannot reliably decode the data. If the $S_0$ is above $T_1$, the data is passed directly out of the ECC system 410 without any attempted decoding. In some implementations, the control mechanism 430a is a component of the first decoder 420.

If the $S_0$ is below $T_1$ (if $S_0<T_1$), the $S_0$ is then compared to $T_2$. $T_2$ is a value above which the first decoder 420 comprising the LDPC algorithm 422 and BCH algorithm 424 cannot or will not reliably decode the data. If the $S_0$ is above the set threshold $T_2$ (if $S_0>T_2$), the data is passed to the second decoder 440 without an attempt to decode the data by the first decoder 420. If the $S_0$ is below $T_2$ (if $S_0<T_2$), the first decoder 420 attempts to continue to decode the data.

The first decoder iteratively applies the LDPC algorithm 422 to the data to identify and correct errors in the data. After a predetermined number of iterations, the BCH algorithm 424 calculates a BCH ELP and a number of roots which satisfy the ELP ($N_{ELP}$) and sends this to a control mechanism 430a. The number of roots which satisfy the ELP is compared by the control mechanism 430a to a third predetermined threshold, $T_3$. If $N_{ELP}$ is lower than $T_3$, for example, if $N_R<T_3$, the control mechanism 430a informs the BCH algorithm 424 that the LDPC algorithm 422 has sufficiently decoded or completely decoded the data. The BCH algorithm 424 may then correct additional errors in the code and passes the data out of the ECC system 410 to the data repository 450.

If $N_{ELP}$ is greater than $T_3$, for example, $N_R>T_3$, the control mechanism 430a instructs the LDPC decoder 422 to calculate a second LDPC syndrome, $S_1$, for the data which sends it to the control mechanism 430a. The control mechanism 430a compares the $S_1$ to a fourth predetermined threshold, $T_4$. The control mechanism either instructs the first decoder 420 to iterate again or send the data to the second decoder 440 as a result of the comparison. For example, if $S_1<T_4$, the first decoder 420 iteratively attempts to decode the data again. It $S_1>T_4$, the first decoder 420 instead directs the data to the second decoder 440. In some implementations, $T_4$ is equal to one of $T_1$ or $T_2$. In some implementations, $T_4$ includes both $T_1$ and $T_2$. The BCH code performs the check after a set number of LDPC code iterations to determine if the data has been successfully decoded or if an appropriate stopping point has otherwise been reached.

Use of a single-bit LDPC decoder, also known as a hard-bit-voting decoder, along with a mechanism for determining an appropriate decoding path for a received encoded data reduces the power in the LDPC-based ECC system. Calculation of the LDPC syndrome as an estimate of the number of errors in the received code before the LDPC code decodes the data can decrease the power consumed by the system if the LDPC syndrome indicates, through comparison to a threshold, that the LDPC code should not attempt to decode the data block either because the data is error free or because the data contains so many errors that successful decoding by the LDPC code is unlikely. In comparison with traditional methods, in which the decoder attempts to decode the data before any check is performed to determine if the data contains errors, in the system of FIG. 4, a check is performed by a control mechanism before full decoding is attempted, and checks are performed periodically after to determine if the data has been completely decoded. In cases in which the data is received without errors, no unnecessary energy is spent attempting to decode error-free data. Furthermore, performing a check before the first decoder begins a full decoding attempt lowers the energy consumption of the ECC system, and performing additional checks periodically during the decoding prevents expenditure of unnecessary computing power by the first decoder which instead hands the decoding over to the second decoder.

Figure 5:
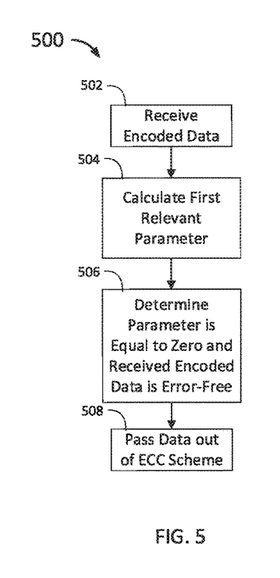
FIG. 5 shows a flow chart illustrating a path through the ECC system for a received encoded data packet having no errors, according to an embodiment.

FIG. 5 shows a flow chart 500 illustrating a path through the ECC system for a received data having no errors. At step 502, data is received by the ECC system. The data may be a packet of data received from a memory. At step 504, the control mechanism calculates a first relevant parameter based on the packet of data. The relevant parameter may be an LDPC syndrome or another measure of the SNR of the data packet. At step 506, the control mechanism determines, based on the relevant parameter, that the received data is error-free. For example, the calculated first relevant parameter may be zero, indicating an error free transmission. In some implementations, the first relevant parameter may be compared to a threshold such that when the first relevant parameter is zero, the control mechanism determines that the transmission is error free. At step 508, the data is passed out of the ECC system to a data repository.

Figure 6:
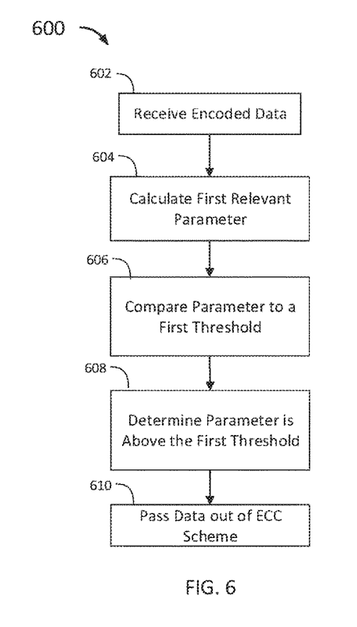
FIG. 6 shows a flow chart illustrating a path through the ECC system for a received encoded data packet including a large number of errors, according to an embodiment.

FIG. 6 shows a flow chart 600 illustrating the path of a received data packet including a number of errors so large as to make the data packet un-decodable and/or impractical to decode. At step 602, data is received by the ECC system, for example from a memory. At step 604, the control mechanism calculates a first relevant parameter based on the packet of data. At step 606, the control mechanism compares the first relevant parameter to a first threshold. The first threshold is a predetermined threshold chosen such that a code with a relevant parameter that exceeds the first threshold contains an amount of errors so large that it is unlikely that the first or the second decoder will decode the data. In some implementations, the first threshold is set such that the first or the second decoder will not be able to decode the data for which the relevant parameter exceeds the threshold within a predetermined amount of time or within a predetermined number of iterations. In some implementations, the first threshold is set such that data for which the relevant parameter exceeds the threshold has a very low signal to noise or contains too many errors and successful decoding of the data is not possible. At step 608, the control mechanism determines that the first relevant parameter is above the first threshold. At step 610, the data is passed out of the ECC system to a data repository.

Figure 7:
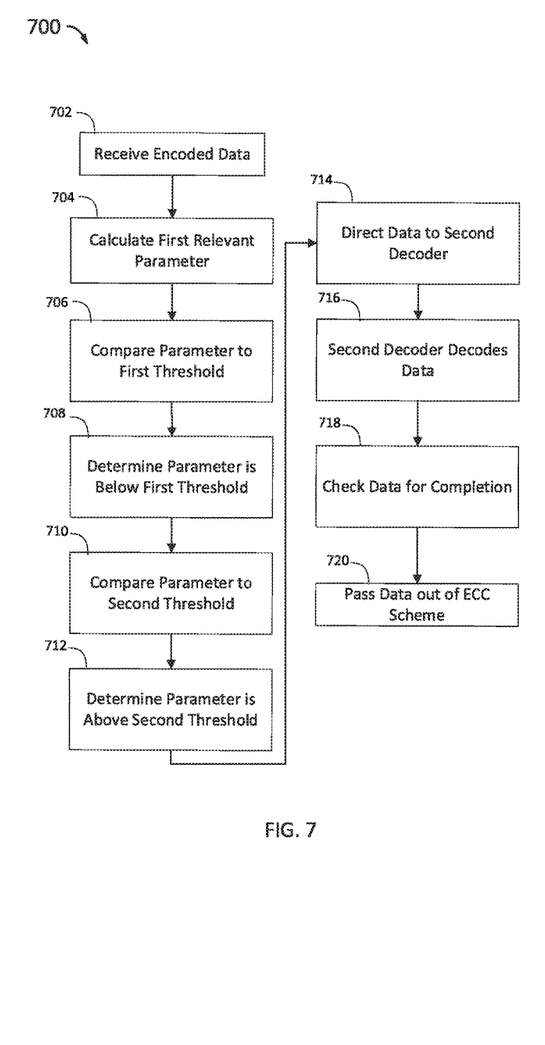
FIG. 7 shows a flow chart illustrating a path through the ECC system for a received encoded data packet that is un-decodable by a first decoder, according to an embodiment.

FIG. 7 shows a flow chart 700 illustrating a path through the ECC system for received data including a large number of errors. At step 702, data is received by the ECC system, for example from a memory. At step 704, the control mechanism calculates a first relevant parameter based on the received data. At step 706, the control mechanism compares the first relevant parameter to a first threshold. At step 708, the control mechanism determines that the first relevant parameter is below the first threshold. At step 710, the control mechanism compares the first relevant parameter to a second threshold. The second threshold may be a predetermined parameter indicating a value of the relevant parameter associated with data for which the second decoder must be used in order to successfully complete the decoding. In some implementations, the second threshold is initially a predetermined value indicating the second decoder is best suited to decode the data, and the second threshold is updated during the continued decoding of additional amounts of data received from a same transmission. At step 712, the control mechanism determines that the first relevant parameter is above the second threshold. At step 714, the data is directed to the second decoder. The second decoder is a high powered decoder which is capable of decoding a number of errors with greater precision than the first decoder. At step 716, the second decoder decodes the data. The second decoder may be an inline decoder, an LDPC decoder, a BCH decoder, a Turbo decoder, or any other type of decoder. At step 718, the data is checked for completion. For example, the second decoder may direct the data to the control mechanism. In some implementations a second control mechanism having a separate circuitry is included for this step. In some implementations, a single control mechanism is included. The control mechanism may determine that the data is error-free by calculating a second relevant parameter, the same or different than the relevant parameter calculated at step 704. For example, the second relevant parameter may be an LDPC syndrome for the data, an SNR for the data, or a number of BCH ELP roots. At step 720, if the data has been determined to be error-free and the decoding is completed, the data is passed out of the ECC system.

Figure 8:
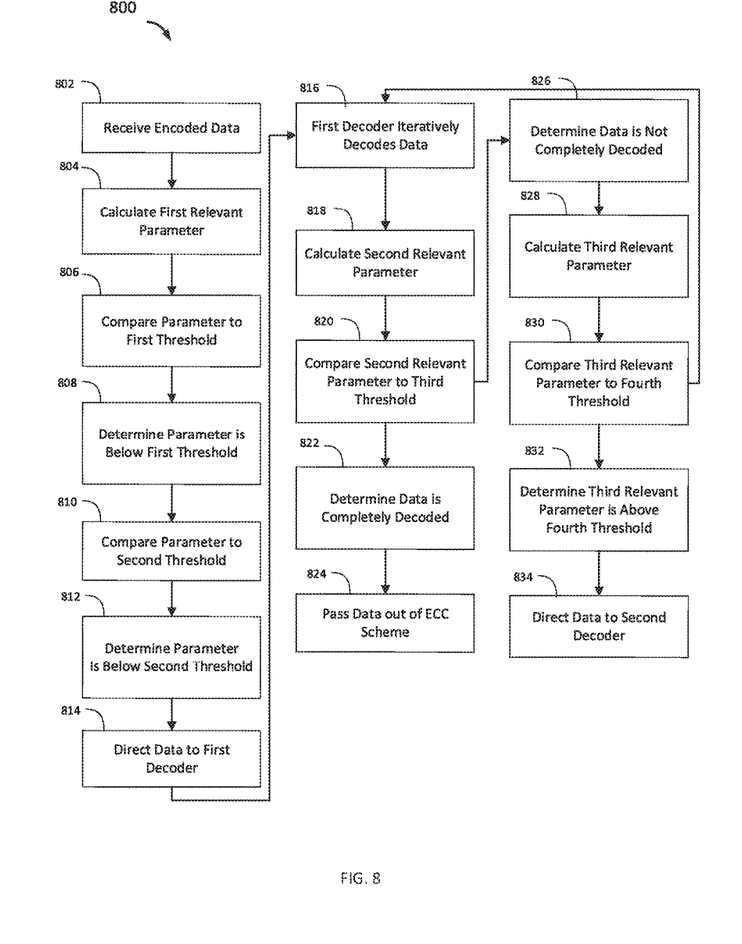
FIG. 8 shows a flow chart illustrating a method of decoding encoded data at an ECC system decoder, according to an embodiment.

FIG. 8 shows a flow chart 800 illustrating a method of decoding encoded data at an ECC system decoder. At step 802, data is received by the ECC system, for example from a memory. At step 804, the control mechanism calculates a first relevant parameter based on the packet of data. At step 806, the control mechanism compares the first relevant parameter to a first threshold. At step 808, the control mechanism determines that the first relevant parameter is below the first threshold. At step 810, the control mechanism compares the first relevant parameter to a second threshold.

At step 812, the control mechanism determines that the first relevant parameter is below the second threshold. The first relevant parameter failing to exceed the second threshold indicates that the data is likely to be successfully decoded by the first decoder. At step 814, the data is directed to the first decoder. The first decoder has lower power requirements than the second decoder and additionally may be able to decode a small number of errors in a data packet more quickly and with less power than the second decoder. At step 816, the first decoder proceeds to decode the data by iteratively applying a decoding algorithm to the data for a predetermined number of iterations. The predetermined number of iterations may be based on the expected number of errors in a data packet which is routed to the first decoder. After the predetermined number of iterations of the first decoder, the control mechanism calculates a second relevant parameter based on the decoded or partially decoded data at step 818.

At step 820, the control mechanism compares the second relevant parameter to a third threshold. The second relevant parameter may be a BCH ELP number of roots. If the second relevant parameter satisfies the third threshold, the control mechanism determines that the data has been successfully decoded at step 822, and the data is passed out of the ECC system at step 824. If, when compared at step 820, it is determined that the second relevant parameter does not satisfy the third threshold at step 826 and therefore is not completely decoded, the control mechanism calculates a third relevant parameter at step 828. The third relevant parameter may be the same as the first relevant parameter. For example, the third relevant parameter may be an LDPC syndrome, of another measure of the SNR of the data. At step 830, the third relevant parameter is compared to a fourth threshold. The fourth threshold is a predetermined threshold, for which parameters are above the threshold are likely to be successfully fully decoded only by the second decoder. If the third relevant parameter is determined to be above the fourth threshold at step 832, the data is passed to the second decoder at step 834. The second decoder then decodes the data and, when the decoding is completed, passes the data out of the ECC system. If, however, the third relevant parameter is determined to be below the fourth threshold when compared at step 830, the data is returned to the first decoder, and the process is repeated from step 816. In this manner, data is routed through the ECC system with a minimum power usage. The power usage of the ECC system is minimized by removing decoding attempts based upon the result of comparing parameters with the respective thresholds as discussed herein.

Figure 9:
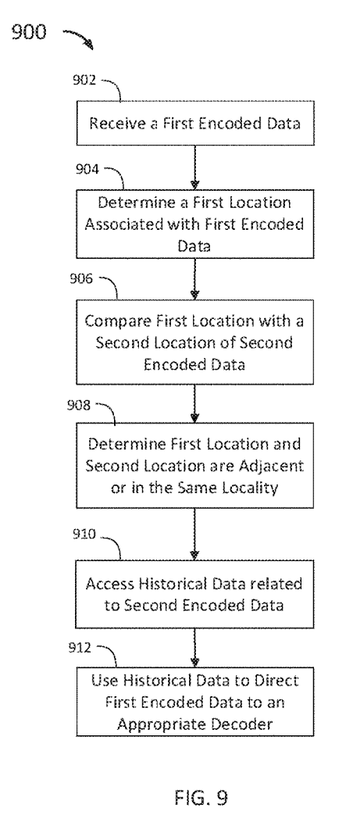
FIG. 9 shows a flow chart illustrating a method of using historical data to determine the decoding pathway of a data packet.

FIG. 9 shows a flow chart 900 schematically illustrating a method of using historical data to determine the decoding pathway of received data. At step 902, data is received in the ECC system. At step 904, a location within a transmission associated with the received data is determined. For example, data transmitted from a flash memory may be associated with a particular flash page or a portion of a flash page. At step 906, the determined location is compared with a previous location associated with received data decoded by the ECC system immediately prior to receiving the data. At step 908, the location is determined to be adjacent to or in the same locality as the previous location. In some implementations, adjacent or in the same locality may mean that the data is within the same flash memory page. In some implementations, it may mean that data is within flash memory pages which are located within the same region of the flash memory block. In some implementations, it may mean that the data is located within the same flash memory block or flash memory die. At step 910, historical data stored in a memory related to the decoding pathway of data decoded by the ECC system immediately prior to receiving the data is accessed by the control mechanism. At step 912, the historical data is used to route the data to an appropriate decoder within the ECC system.

Storing and accessing historical data related to the previously decoded data to determine the appropriate pathway for the next received data further decreases the power used by the ECC system by eliminating the need to calculate relevant parameters and compare the parameters to thresholds for encoded data which are received from similar locations within a transmission. For example, as data stored in flash memory degrades over time, data read long after the data was originally written may include too many errors to be decoded. Rather than attempt to decode subsequently received data read long after it was written after a first amount of received data fails to be decoded, additional received data from a similar location in the transmission are also failed without using power to attempt decoding. Similarly, data read soon after it was written may be decoded by the first decoder and so subsequent related transmissions are routed directly to the first decoder without initial calculations of parameters for comparison to thresholds.

Figure 10:
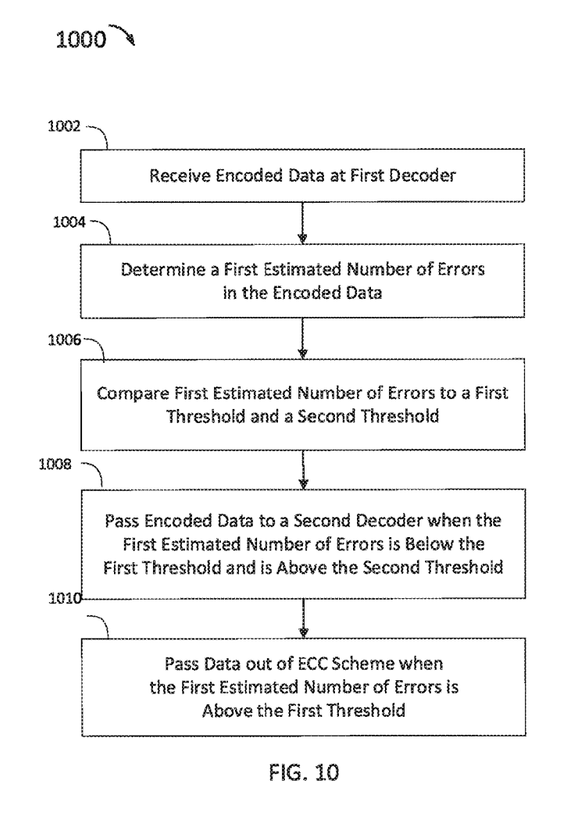
FIG. 10 shows a flow chart illustrating a method of decoding a data packet in an ECC system.

FIG. 10 shows a flow chart 1000 schematically illustrating a method of decoding received data in an ECC system. At step 1002, encoded data is received at the first decoder. At step 1004, a first estimated number of errors in the encoded data are determined at the first decoder. At step 1006, the first estimated number of errors is compared to a first threshold and a second threshold. At step 1008, the encoded data is passed to a second decoder when the first estimated number of errors is below the first threshold and is above the second threshold. At step 1010, the encoded data is passed out of the ECC system when the first estimated number of errors is above the first threshold.

In some implementations, when the first estimated number of errors is below the first threshold and the second threshold, the first decoder attempts to decode the encoded data. In some implementations, after attempting to decoder the encoded data at the first decoder, a second estimated number of errors remaining in the encoded data is calculated. A number of error locators for the encoded data is also determined, and the number of error locators and the second estimated number of errors are compared to a third predetermined threshold and a fourth predetermined threshold, respectively. The encoded data may be passed out of the ECC system when the number of error locators satisfies the third threshold. The encoded data is passed from the first decoder to the second decoder when the number of error locators fails to satisfy the third threshold and the second estimated number of errors is below the fourth threshold.

In some implementations, the first decoder reattempts to decode the encoded data when the number of error locators fails to satisfy the third threshold and the second estimated number of errors is above the fourth threshold.

In some implementations, the first estimated number of errors, the second estimated number of errors, and the number of error locators associated with the encoded data associated with a first encoded data are recorded to a memory and a first location on a flash page associated with the first encoded data is also recorded. A second encoded data associated with a second location on the flash page is then received, and the first estimated number of errors associated with the first encoded data is retrieved from the memory. A determination is then made as to whether to attempt to decode the second encoded data at the first decoder, the second decoder, or at all by comparing the first estimated number of errors to the first threshold and the second threshold.

By applying the methods and systems described herein, an ECC system is able to decode data while maximizing energy efficiency and minimizing the computational resources used in decoding a transmission. Multiple decoders within the ECC system including a low power decoder able to decode a majority of received data enables the ECC system to decode a large portion of the transmission using lower-power algorithms. Data which is received with more errors and is more difficult to decode may be routed to the higher powered decoder. Additionally, performing frequent checks to determine if the data decoding is complete or is possible prevents unnecessary decoding attempts, further limiting power expenditure.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

What is claimed is:

1. An Error Correction Code ("ECC") system comprising:
   a controller;
   a first decoder communicatively coupled to the controller and configured to decode encoded data when a first number of errors in the encoded data is equal to or below a first threshold; and
   a second decoder communicatively coupled to the controller and configured to decode the encoded data when the first number of errors is above the first threshold and is below a second threshold,
   wherein the controller is configured to
      control the ECC system to bypass the first decoder by transmitting the encoded data to the second decoder when the first number of errors is above the first threshold and is below the second threshold, and
      control the ECC system to bypass the first decoder and the second decoder by outputting the encoded data out of the ECC system when the first number of errors is equal to or above the second threshold.

2. The ECC system of claim 1, wherein the first decoder is further configured to attempt to decode the encoded data when the first number of errors is below the first threshold and the second threshold.

3. The ECC system of claim 2, wherein after the first decoder attempts to decode the encoded data, the ECC system is further configured to:
   estimate a second number of errors remaining in the encoded data,
   determine a number of error locators for the encoded data, and
   compare the second number of errors and the number of error locators to a third threshold and a fourth threshold, respectively.

4. The ECC system of claim 3, wherein the first decoder is configured to pass the encoded data to the second decoder when the number of error locators is above the fourth threshold.

5. The ECC system of claim 4, wherein the first decoder is configured to pass the encoded data out of the ECC decoder when the number of error locators is below the fourth threshold.

6. The ECC system of claim 5, wherein the first decoder is configured to reattempt to decode the encoded data when the number of error locators is above the fourth threshold and the second number of errors is below the third threshold.

7. The ECC system of claim 6, wherein the ECC system is configured to record to a memory the first number of errors, the second number of errors, and the number of error locators associated with the encoded data.

8. The ECC system of claim 7, wherein the encoded data is a first encoded data, and the ECC system is configured to record a first location associated with the first encoded data, and compare the first location to a second location associated with a received second encoded data.

9. The ECC system of claim 8, wherein if the first location and the second location are adjacent or within the same locality, the first decoder is configured to retrieve the first number of errors associated with the first encoded data from the memory, and is further configured to determine, based on the retrieved first number of errors, whether to attempt to decode the second encoded data at the first decoder or at the second decoder by comparing the retrieved first number of errors to the first threshold and the second threshold and without estimating a new number of errors for the second encoded data.

10. The ECC system of claim 2, wherein the first decoder is configured to attempt to decode the encoded data by applying a low-density parity-check ("LDPC") algorithm to the encoded data.

11. The ECC system of claim 3, wherein the first number of errors is derived from an LDPC syndrome.

12. A method of decoding encoded data at an Error Correction Code ("ECC") system, the method comprising:
   receiving, at a controller, encoded data, the controller communicatively coupled to a first decoder and a second decoder;
   decoding the encoded data at the first decoder when a first estimated number of errors is equal to or below a first threshold;
   bypassing the first decoder by transmitting the encoded data to the second decoder when the first estimated number of errors is above the first threshold and is below a second threshold;
   decoding the encoded data at the second decoder when the first estimated number of errors is above the first threshold and is below the second threshold; and bypassing the first decoder and the second decoder by outputting the encoded data out of the ECC system when the first estimated number of errors is equal to or above the second threshold.

13. The method of claim 12, further comprising:
attempting, at the first decoder, to decode the encoded data when the first estimated number of errors is below the first threshold and the second threshold.

14. The method of claim 13, further comprising:
after attempting to decode the encoded data at the first decoder, determining, at the ECC system, a second estimated number of errors remaining in the encoded data;
determining a number of error locators for the encoded data; and
comparing the second estimated number of errors and the number of error locators to a third threshold and a fourth threshold, respectively.

15. The method of claim 14, further comprising:
passing the encoded data from the first decoder to the second decoder when the number of error locators is above the fourth threshold.

16. The method of claim 15, further comprising:
passing the encoded data out of the ECC system when the number of error locators is below the fourth threshold.

17. The method of claim 16, further comprising:
reattempting to decode the encoded data at the first decoder when the number of error locators is above the fourth threshold and the second estimated number of errors is below the third threshold.

18. The method of claim 17, further comprising:
recording to a memory the first estimated number of errors, the second estimated number of errors, and the number of error locators associated with the encoded data, wherein the encoded data is a first encoded data;
recording a first location on a flash page associated with the first encoded data;
receiving a second encoded data associated with a second location on the flash page;
accessing the first estimated number of errors associated with the first encoded data; and
determining whether to attempt to decode the second encoded data at the first decoder, the second decoder, or at all by comparing the first estimated number of errors to the first threshold and the second threshold.

* * * * *